United States Patent
Wittenbreder, Jr.

(10) Patent No.: US 6,580,255 B1
(45) Date of Patent: Jun. 17, 2003

(54) ADAPTIVE GATE DRIVERS FOR ZERO VOLTAGE SWITCHING POWER CONVERSION CIRCUITS

(75) Inventor: Ernest H. Wittenbreder, Jr., Flagstaff, AZ (US)

(73) Assignee: Technical Witts, Inc., Flagstaff, AZ (US)

( * ) Notice: Subject to any disclaimer, the term of this patent is extended or adjusted under 35 U.S.C. 154(b) by 0 days.

(21) Appl. No.: 10/157,102

(22) Filed: May 28, 2002

Related U.S. Application Data

(62) Division of application No. 10/076,008, filed on Feb. 12, 2002, now Pat. No. 6,462,963.

(51) Int. Cl.[7] .................................................. G05F 1/10
(52) U.S. Cl. .................................................... 323/235
(58) Field of Search ................................. 323/235, 271, 323/282, 284, 319; 363/16; 327/31, 37, 427, 432

(56) References Cited

U.S. PATENT DOCUMENTS

| | | | | |
|---|---|---|---|---|
| 3,557,381 A | * | 1/1971 | Henry | 361/6 |
| 3,758,844 A | * | 9/1973 | Harkenrider et al. | 323/235 |
| 3,882,328 A | * | 5/1975 | Mazgy et al. | 327/79 |
| 3,917,962 A | * | 11/1975 | Pascente | 327/452 |
| 3,947,752 A | * | 3/1976 | Morgan | 323/284 |
| 4,720,667 A | * | 1/1988 | Lee et al. | 323/271 |
| 5,343,140 A | * | 8/1994 | Gegner | 323/222 |
| 6,462,963 B1 | * | 10/2002 | Wittenbreder | 363/16 |
| 6,483,369 B1 | * | 11/2002 | Wittenbreder, Jr. | 327/427 |

* cited by examiner

Primary Examiner—Adolf Deneke Berhane

(57) ABSTRACT

Simple adaptive gate drive circuits, applicable to switches that turn on at zero voltage, such as mosfets or IGBTs, are revealed. The new gate drive circuits improve the timing for turn on of the switches, reduce gate drive losses, and limit gate voltage stress. In its simplest form the gate drive circuit requires only a single small mosfet and two diodes. The adaptive gate drive circuit provides optimal switch turn on timing for the case in which the drive energy available to drive the turn on transition is sufficient to drive the main switch to zero volts. The adaptive gate drive circuit also provides optimal switch turn on timing for the case in which the energy available to drive the transition is insufficient to drive the transition all the way to zero volts, turning the main switch on at the minimum main switch voltage thereby minimizing main switch switching losses.

6 Claims, 3 Drawing Sheets

ADAPTIVE GATE DRIVERS FOR ZERO VOLTAGE SWITCHING POWER CONVERSION CIRCUITS

The subject invention is a division of a pending patent whose Ser. No. is 10/076,008, filed Feb. 12, 2002, now U.S. Pat. No. 6,462,963.

BACKGROUND OF THE INVENTION

1. Field of the Invention

The subject invention generally pertains to electronic power conversion circuits, and more specifically to high frequency, switched mode power electronic converter circuits.

2. Description of Related Art

Most soft switching or zero voltage switching (ZVS) converters require a brief dead time between operation of the switches to achieve ZVS. The amount of dead time required is dependent on the current magnitudes and component values so that the chosen dead time is often close to the amount of dead time needed for a range of currents but often the fixed dead time results in additional losses because the switch is turned on too soon when there is applied voltage to the switch or too late after the switch body diode or other parallel diode has been conducting for a time and dissipating power at a rate greater than the switch would dissipate if it were turned on at the best possible time. What is needed is a simple gate circuit that senses the mosfet drain voltage and enables the mosfet at the instant when the drain source voltage drops to zero.

In some cases, particularly at high line and/or light load, the energy available to drive a zero voltage transition is insufficient to drive the switch voltage to zero volts. In the energy insufficient case the switch is driven down to a minimum value and then the switch voltage rises up until the switch is turned on, generally after some fixed time delay. When the switch is turned on in the energy insufficient case the switching losses can be considerable. What is needed is a simple gate drive circuit that can turn on the main switch when the switch voltage is at its minimum value for the energy insufficient case.

OBJECTS AND ADVANTAGES

An object of the subject invention is to provide a circuit mechanism that can accomplish optimal gate timing for switches that turn on at zero voltage.

Another object of the subject invention is to provide a circuit mechanism that can accomplish optimal gate timing for switches that are intended to turn on at zero voltage when there is insufficient energy available to drive the switch to zero volts.

Further objects and advantages of my invention will become apparent from a consideration of the drawings and ensuing description.

Optimal gate timing is provided for zero voltage switches by a simple circuit consisting of a small mosfet and two rectifiers. For the case where there is insufficient gate drive energy to drive the switch to zero volts a simple circuit is provided that turns the switch on at the minimum switch voltage.

SUMMARY

The subject invention reveals adaptive gate drive circuits that achieve optimal switch timing for zero voltage switches. The adaptive driver circuit senses the switch voltage and turns the switch on when the switch voltage has reached zero or a minimum voltage different than zero.

DESCRIPTION OF THE PREFERRED EMBODIMENTS

Figure 1:
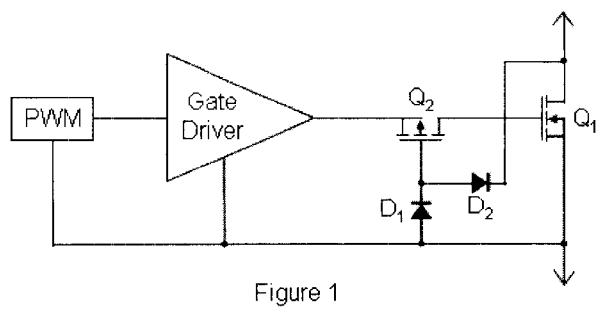
FIG. 1 illustrates an adaptive gate drive circuit that provides optimal switch timing for ZVS power mosfets according to the subject invention.
Figure 2:
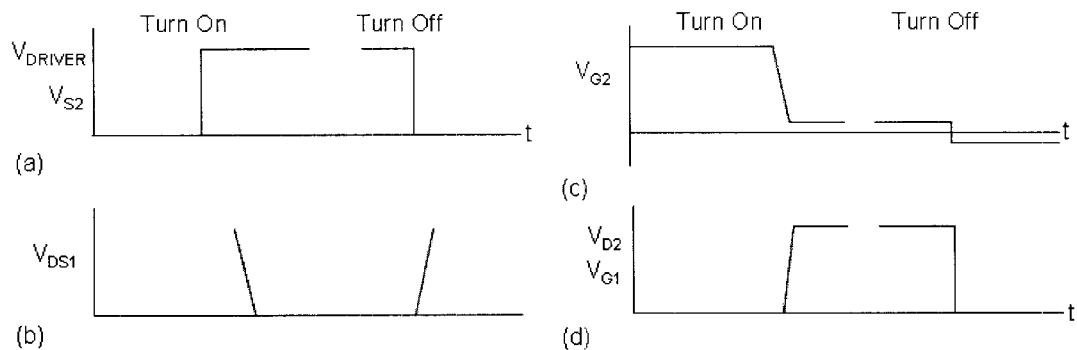
FIG. 2(a) illustrates the driver signal applied to the gate drive circuit of FIG. 1.
FIG. 2(b) illustrates the switch voltage for the FIG. 1 circuit.
FIG. 2(c) illustrates the gate voltage of the $Q_2$ transistor of the FIG. 1 circuit.
FIG. 2(d) illustrates the drain voltage of the $Q_2$ transistor of the FIG. 1 circuit.

FIG. 1 illustrates an adaptive gate driver circuit that uses a small P channel mosfet, $Q_2$, and a pair of diodes, D1 and D2, to control the turn on timing of a N channel mosfet $Q_1$. Let's assume that the N channel mosfet is off and its gate voltage is low. When the output of the gate driver rises, as illustrated in FIG. 2(a), the source of $Q_2$ rises, and also, the gate of $Q_2$ rises, as illustrated in FIG. 2(c), since the gate and source are ac coupled through the inherent gate source capacitance of $Q_2$ and the diode $D_1$ blocks the charging of the gate source capacitor. The P channel mosfet $Q_2$ is not turned on until the drain of the N channel mosfet $Q_1$ falls to the voltage level of its source, as illustrated in FIG. 2(b), or when the applied voltage to the N channel mosfet $Q_1$ is zero, as desired, to accomplish ZVS. This is accomplished by the diode $D_2$ which tracks the voltage at the drain of $Q_1$. As the drain of $Q_1$ falls towards the source the anode of $D_2$ forces the gate of $Q_2$ low which charges the gate source capacitance of $Q_2$ and enables the $Q_2$ P channel mosfet which results in the charging of the gate of $Q_1$, as illustrated in FIG. 2(d). During the turn off transition the gate driver output falls, discharging the gate of the N channel $Q_1$ through the body diode of the P channel mosfet $Q_2$ with no delay. This mechanism does not rely on a gate driver timing delay during the turn on transition, so that the actual gate delay will depend only on the time it takes for the applied voltage of the N channel mosfet to fall to zero.

Figure 3:
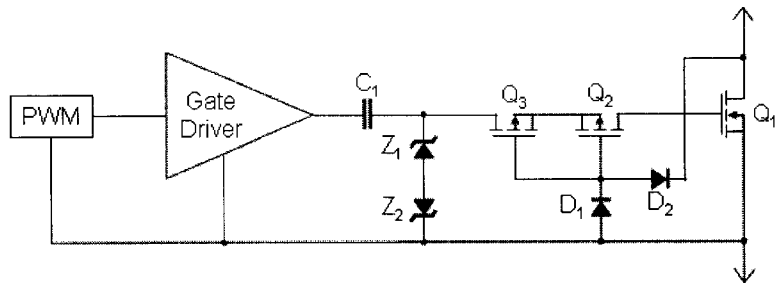
FIG. 3 illustrates an adaptive gate drive circuit that provides optimal switch timing and mosfet gate voltage limiting according to the subject invention.

FIG. 3 illustrates another embodiment of the subject invention which employs a second P channel mosfet, a coupling capacitor, and a pair of zener diodes to clamp the voltage range applied to the P channel mosfets. The P channel mosfet $Q_2$ of FIG. 3 operates the same as the $Q_2$ mosfet of the FIG. 1 circuit. The $Q_3$ P channel mosfet clamps the voltage at the source of the $Q_2$ mosfet to a level near the source voltage of the $Q_1$ N channel mosfet during the turn off transition. During the turn on transition the body diode of the $Q_3$ mosfet conducts and the channel of the $Q_3$ mosfet turns on when the channel of the $Q_2$ mosfet turns on, since the gate source voltage of $Q_3$ is the same as the gate source voltage of $Q_2$. During the turn off transition as the sources of the two P channel mosfets approach the level of the source of the N channel mosfet, both of the P channel mosfets turn off together. The voltage at the gates of the P channel mosfets is limited to one forward voltage drop of the $D_1$ diode below the source voltage of the N channel mosfet. If the voltage at the drain of $Q_3$ continues to fall below the voltage of the source of the N channel mosfet, the voltage appears across the channel of the $Q_3$ mosfet while both the source and drain of the $Q_2$ mosfet is maintained near the voltage level of the source of the N channel mosfet. The $Q_3$ P channel mosfet provides gate breakdown voltage protection for the N channel mosfet $Q_1$ in addition to minimizing the amount of gate charge required by the gate drive energy source.

Figure 4:
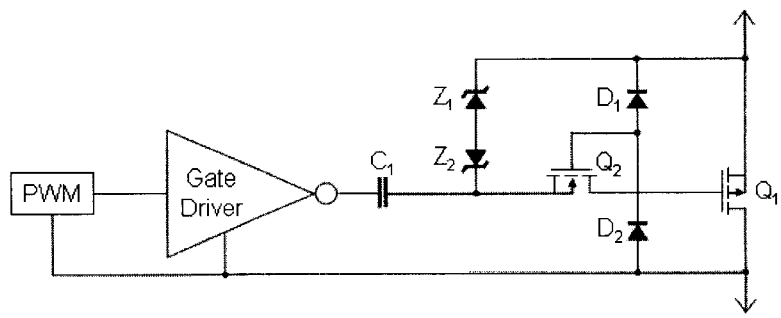
FIG. 4 illustrates a complementary form of the adaptive gate driver of the subject invention applied to a P channel main switch.

FIG. 4 illustrates another embodiment of the subject invention in which the main zero voltage switch is a P channel mosfet and the mosfet that controls the gate voltage for the main switch is an N channel mosfet. Each transistor is the complementary type to the type illustrated in the FIG. 1 circuit.

Figure 5:
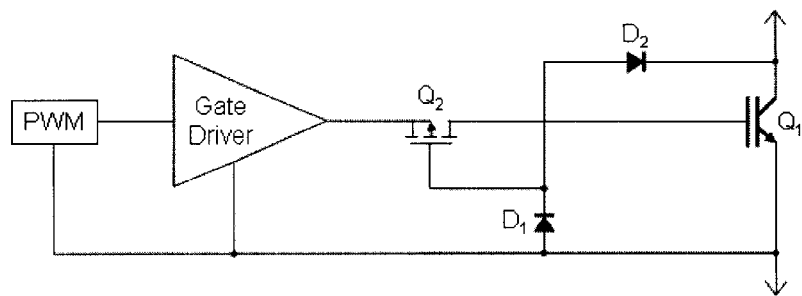
FIG. 5 illustrates the adaptive gate driver of the subject invention applied to an IGBT.

FIG. 5 illustrates another embodiment of the subject invention, similar to the embodiment illustrated in FIG. 1, in which the main ZVS switch is an insulated gate bipolar transistor (IGBT).

Figure 6:
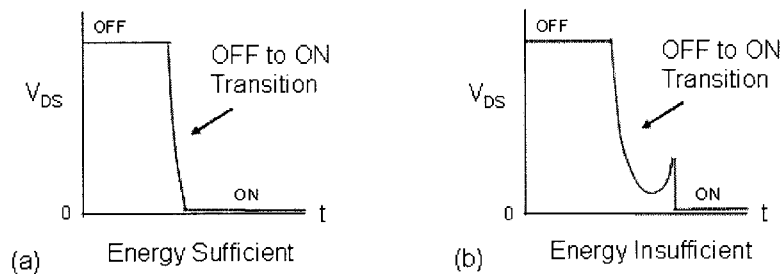
FIG. 6(a) illustrates the switch voltage wave form for an energy sufficient turn on transition of a zero voltage switch.
FIG. 6(b) illustrates the switch voltage wave form for an energy insufficient turn on transition of a zero voltage switch.

FIG. 6(a) illustrates the switch voltage of a turn on transition of a zero voltage switch for a transition in which there is sufficient energy available to drive the switch to zero volts.

Figure 7:
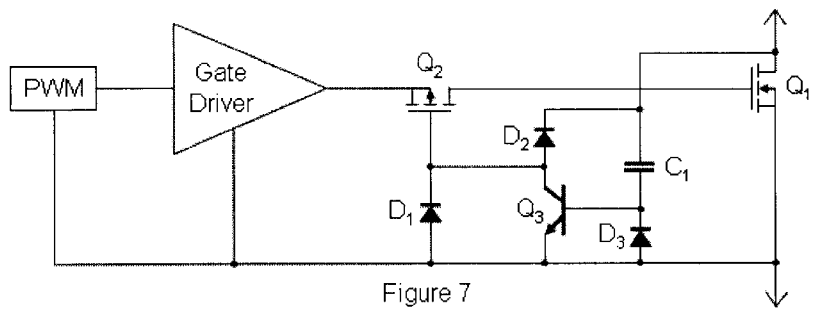
FIG. 7 illustrates a form of the subject invention that enables the switch at the minimum switch voltage.
Figure 8:
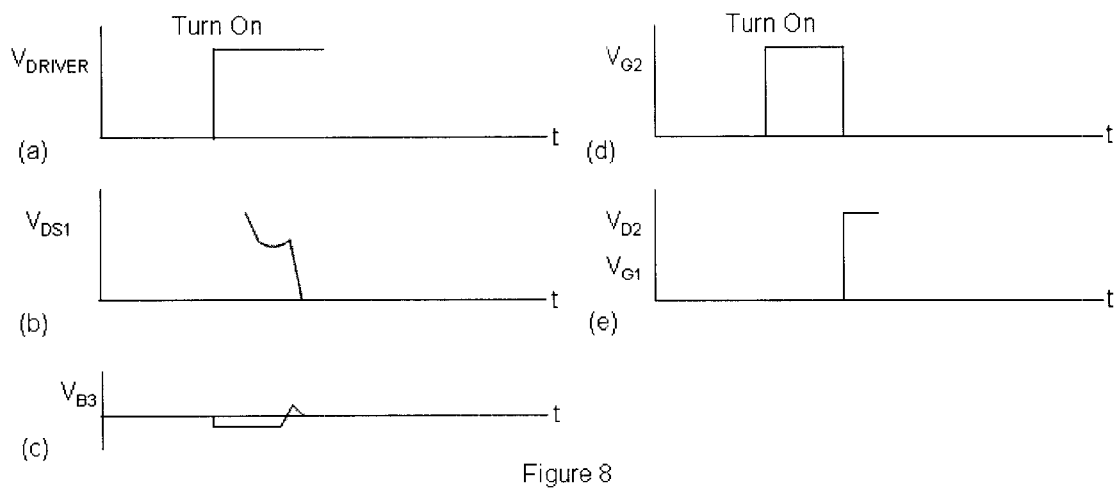
FIG. 8(a) illustrates the gate driver wave form for the FIG. 7 circuit.
FIG. 8(b) illustrates the switch voltage for an energy insufficient turn on transition for the FIG. 7 circuit.
FIG. 8(c) illustrates the $Q_3$ base voltage wave form for the FIG. 7 circuit.
FIG. 8(d) illustrates the $Q_2$ gate voltage wave form for the FIG. 7 circuit.
FIG. 8(e) illustrates the $Q_2$ drain voltage wave form for the FIG. 7 circuit.

FIG. 6(b) illustrates the switch voltage during a turn on transition of a zero voltage switch for a transition in which there is insufficient energy available to drive the switch to zero volts. For this case the energy available drives the switch voltage down to a minimum value and then reverses direction and the switch voltage rises again until the switch is turned on at a voltage that is not optimal and incurs significant switching losses. FIG. 7 illustrates a circuit that addresses the issue of insufficient energy to drive the zero voltage transition. The turn on transition begins with the rise in the output of the gate driver, as illustrated in FIG. 8(a). As the drain voltage of $Q_1$ falls, as illustrated in FIG. 8(b), the capacitor $C_1$ discharges into the drain of $Q_1$. The $C_1$ current flows in the diode $D_3$ forward biasing the diode $D_3$. The voltage wave form at the cathode of diode $D_3$ and the base of transistor $Q_3$ is illustrated in FIG. 8(c). As the $Q_1$ switch voltage reaches its minimum the capacitor $C_1$ is no longer discharging and the current flow in the diode $D_3$ stops. As the switch voltage begins to increase above its minimum the voltage at the base of transistor $Q_3$ rises, turning on transistor $Q_3$. When transistor $Q_3$ turns on, it forces the gate voltage of $Q_2$ to fall charging the gate source capacitance of the P channel mosfet $Q_2$, as illustrated in FIG. 8(d), and turning on $Q_2$. Turning on $Q_2$ enables charge to flow to the gate of $Q_1$ which turns on the main switch at its minimum switch voltage, which is the desired result.

Figure 9:
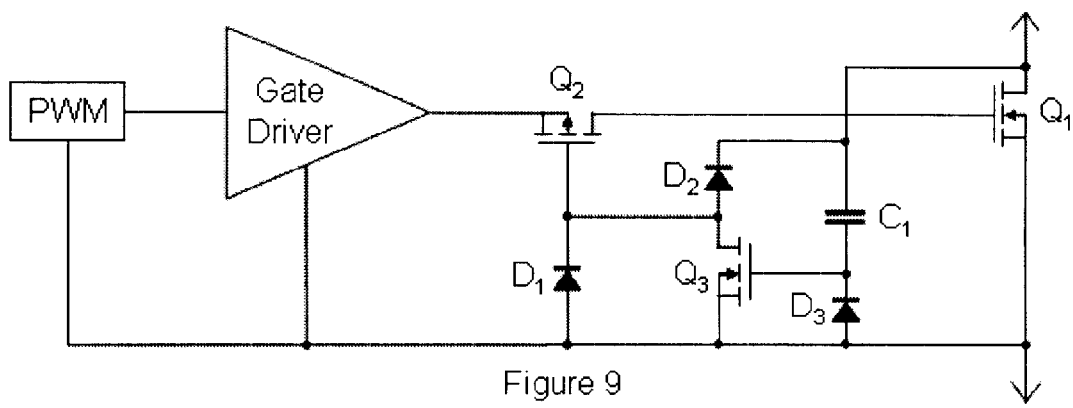
FIG. 9 illustrates a variation of the FIG. 7 circuit that uses a mosfet transistor instead of a bipolar transistor.

FIG. 9 illustrates another embodiment of the subject invention in which the bipolar transistor $Q_3$ of FIG. 7 is replaced by a N channel mosfet transistor. Preferably a low threshold N channel mosfet should be used for the $Q_3$ transistor.

Conclusion, Ramifications, and Scope of Invention

Thus the reader will see that the adaptive gate drive circuit provides optimal turn on timing for the zero voltage switches and in another embodiment limitation of the mosfet gate charge and gate voltage range. In another embodiment the zero voltage switch is turned on at a minimum voltage if the drive energy for the transition is insufficient to drive the switch voltage to zero volts.

While my above description contains many specificities, these should not be construed as limitations on the scope of the invention, but rather, as exemplifications or preferred embodiments thereof. Many other variations are possible. For example, an embodiment was illustrated that limits the gate voltage swing and the gate energy for an N channel main switch, but similar circuits could be applied to main switches which are IGBTs or P channel mosfets using the techniques taught herein to achieve similar results for different types of main switches. Accordingly, the scope of the invention should be determined not by the embodiments illustrated, but by the appended claims and their legal equivalents.

I claim:

1. An adaptive zero voltage composite switch comprising,
   a first N channel mosfet having gate, source, and drain terminals,
   a first P channel mosfet having gate, source, and drain terminals with said drain terminal of said P channel mosfet connected to said gate terminal of said first N channel mosfet and said source terminal of said P channel mosfet coupleable to a pulse width modulated gate drive signal source,
   a first diode having a cathode terminal and an anode terminal with said anode terminal connected to said source terminal of said first N channel mosfet and coupleable to a pulse width modulated gate drive signal source and with said cathode terminal connected to said gate terminal of said first P channel mosfet,
   a second diode having a cathode terminal and an anode terminal with said anode terminal of said second diode connected to said gate terminal of said first P channel mosfet and with said cathode terminal of said second diode connected to said drain terminal of said first N channel mosfet,
   whereby said adaptive zero voltage composite switch achieves optimal timing for said first N channel mosfet by delaying the turn on of said first N channel mosfet until the drain source voltage of said first N channel mosfet has reached a level of substantially zero volts.

2. The adaptive zero voltage composite switch of claim 1 further comprising, a second P channel mosfet having gate, source, and drain terminals with said gate terminal of said second P channel mosfet connected to said gate terminal of said first P channel mosfet and with said source terminal of said first P channel mosfet connected to said source terminal of said second P channel mosfet instead of coupleable to said pulse width modulated gate drive signal source and with said drain terminal of said second P channel mosfet coupleable to said pulse width modulated gate drive signal source, whereby said second P channel mosfet limits the negative voltage that can be applied to a gate terminal of said first N channel mosfet and said second P channel mosfet limits the amount of charge that can be transferred from said gate terminal of said first N channel mosfet, thereby reducing gate drive power losses.

3. The adaptive zero voltage composite switch of claim 1 comprising an IGBT instead of said first N channel mosfet.

4. The adaptive zero voltage composite switch of claim 1 in which N channel mosfets are replaced by P channel mosfets, P channel mosfets are replaced by N channel mosfets, and the cathode and anode terminals of diodes are reversed, thereby forming a complementary adaptive zero voltage composite switch.

5. The adaptive zero voltage composite switch of claim 1 further comprising, a third diode having cathode and anode terminals with said anode terminal of said third diode connected to said anode terminal of said first diode, a first capacitor having first and second terminals with said first terminal of said capacitor connected to said cathode terminal of said third diode and with said second terminal of said capacitor connected to said drain terminal of said first N channel mosfet, a first NPN bipolar transistor having collector, base, and emitter terminals with said emitter terminal of said NPN bipolar transistor connected to said anode terminal of said third diode, with said base terminal of said NPN bipolar transistor connected to said cathode terminal of said third diode, and with said collector terminal of said NPN bipolar transistor connected to said cathode terminal of said first diode, whereby said adaptive zero voltage composite switch is turned on at a minimum voltage of said adaptive zero voltage composite switch when drive energy used to reduce said adaptive zero voltage composite switch voltage is insufficient to bring said adaptive zero voltage composite switch voltage to zero volts.

6. The adaptive zero voltage composite switch of claim 5 comprising a second N channel mosfet instead of said NPN bipolar transistor.

\* \* \* \* \*